(12) United States Patent
Andrikopoulos et al.

(10) Patent No.: US 10,269,402 B2
(45) Date of Patent: Apr. 23, 2019

(54) MAGNETIC TOPOLOGICAL SOLITON DETECTION

(71) Applicants: IMEC VZW, Leuven (BE); Katholieke Universiteit Leuven, KU LEUVEN R&D, Leuven (BE)

(72) Inventors: Dimitrios Andrikopoulos, Leuven (BE); Bart Soree, Begijnendijk (BE)

(73) Assignees: IMEC VZW, Leuven (BE); Katholieke Universiteit Leuven, KU LEUVEN R&D, Leuven (BE)

( * ) Notice: Subject to any disclaimer, the term of this patent is extended or adjusted under 35 U.S.C. 154(b) by 321 days.

(21) Appl. No.: 15/260,718

(22) Filed: Sep. 9, 2016

(65) Prior Publication Data

US 2017/0076772 A1    Mar. 16, 2017

(30) Foreign Application Priority Data

Sep. 15, 2015  (EP) .................................. 15185321

(51) Int. Cl.
*G11C 11/16* (2006.01)
*H01L 43/08* (2006.01)

(52) U.S. Cl.
CPC ........ *G11C 11/1673* (2013.01); *G11C 11/161* (2013.01); *G11C 11/1675* (2013.01); *H01L 43/08* (2013.01)

(58) Field of Classification Search
CPC ... G11C 11/16; G11C 11/161; G11C 11/1673; G11C 11/1675; H01L 13/08
See application file for complete search history.

(56) References Cited

U.S. PATENT DOCUMENTS 9,979,402 B2 * 5/2018 Vaysset .................. H01L 43/08
10,164,077 B2 * 12/2018 Vaysset .................. B82Y 10/00
(Continued)

FOREIGN PATENT DOCUMENTS

WO    2015/015007 A1    2/2015

OTHER PUBLICATIONS

Sampaio, J. et al., "Nucleation, Stability and Current-Induced Motion of Isolated Magnetic Skyrmions in Nanostructures", Nature Nanotechnology, vol. 8, Nov. 2013, pp. 839-844.
(Continued)

*Primary Examiner* — Gene N Auduong
(74) *Attorney, Agent, or Firm* — McDonnell Boehnen Hulbert & Berghoff LLP

(57) ABSTRACT

A solid-state device configured to generate an electric signal indicative of a presence or an absence of a magnetic topological soliton is disclosed. The solid-state device includes a storage element configured to store a magnetic topological soliton. The storage element includes a topological insulator. The storage element also includes a magnetic strip arranged on the topological insulator. The solid-state device also includes a magnetic topological soliton detector configured to generate the electric signal indicative of the presence or the absence of the magnetic topological soliton in a detection region of the storage element. The magnetic topological soliton detector is adapted for detecting a spin-independent difference in tunneling amplitude, a difference in electrical resistance, or a difference in electrical conductivity through the topological insulator in the detection region due to the presence or the absence of the magnetic topological soliton in the detection region.

19 Claims, 2 Drawing Sheets

(56) References Cited

U.S. PATENT DOCUMENTS

| | | | |
|---|---|---|---|
| 2010/0178510 A1* | 7/2010 | Kaneko | B22F 1/02 |
| | | | 428/403 |
| 2014/0133221 A1* | 5/2014 | Cowburn | G11C 11/14 |
| | | | 365/158 |
| 2017/0033742 A1* | 2/2017 | Akerman | H03B 15/006 |

OTHER PUBLICATIONS

Koshibae, Wataru et al., "Memory Functions of Magnetic Skyrmions", Japanese Journal of Applied Physics, vol. 54, 2015, pp. 053001-1-053001-8.

* cited by examiner

MAGNETIC TOPOLOGICAL SOLITON DETECTION

CROSS-REFERENCE TO RELATED APPLICATIONS

The present application is a non-provisional patent application claiming priority to European Patent Application No. EP 15185321.5, filed Sep. 15, 2015, the contents of which are hereby incorporated by reference.

FIELD OF THE DISCLOSURE

The disclosure relates to the field of spin transport electronics. More specifically it relates to a solid-state device for detecting the presence or absence of a magnetic topological soliton, and to a corresponding method.

BACKGROUND

Spin-dependent electron transport mechanisms are known to have interesting applications in solid-state devices. In particular magnetic topological solitons, which may also be referred to as topological defects, may be used as elemental information carriers. The topological solitons may particularly relate to ferromagnetic topological solitons, or anti-ferromagnetic topological solitons.

Topological defects are particularly stable against small perturbations and decay, for example because such defects are homotopically distinct from the vacuum state. Therefore, the use of topological solitons as bit-encoding information carriers in memory devices can allow for low power consumption, robustness to noise and high transfer speeds. Moreover, logic circuitry could be manufactured which operates directly on streams, e.g. bitstreams, of topological solitons. For example, ultra-high density memory, e.g. a magnetoresistive random access memory, and logic devices may be achieved in accordance with certain embodiments.

An example of ferromagnetic topological solitons which can be used as elemental information carrier is a spin wave or magnon, e.g. a propagating disturbance in the ordering of a magnetic material, forming a boson mode of the spin lattice. Another example is a skyrmion, e.g. a two-dimensional magnetic skyrmion having a chiral nature, e.g. having a non-zero, integer topological charge. Yet another example is a domain wall, e.g. an interface between magnetic domains.

It is known in the art that magnetic topological solitons, e.g. skyrmions, can be generated and manipulated using spin-polarized currents and spin-transfer torques.

However, a need exists in the art for an easy and efficient conversion of information encoded by a magnetic topological soliton to a conventional electronic encoding, e.g. a need exists for a simple and efficient electrical detection of magnetic topological solitons, e.g. such as skyrmions.

SUMMARY

It is an object of some embodiments to provide efficient means and methods for detecting a magnetic topological soliton.

The above objective is accomplished by a method and device according to certain embodiments.

In a first aspect, one embodiment relates to a solid-state device for generating an electric signal indicative of the presence or absence of a magnetic topological soliton. This solid-state device comprises a storage element for storing a magnetic topological soliton. The storage element comprises a topological insulator and a magnetic strip arranged on the topological insulator. The solid-state device further comprises a magnetic topological soliton detector for generating an electric signal indicative of the absence or presence of the magnetic topological soliton in a detection region of the storage element. This magnetic topological soliton detector is adapted for detecting a spin-independent difference in tunneling amplitude, e.g. in tunneling probability, a difference in electrical resistance and/or a difference in electrical conductivity through the topological insulator in the detection region. This difference in tunneling amplitude (e.g. a spin-independent change in magnetoresistance), electrical resistance and/or electrical conductivity is due to the presence or absence of the magnetic topological soliton in the detection region.

In a solid-state device according to embodiments, the magnetic topological soliton detector may be adapted for generating an electric signal indicative of different states of the magnetic topological soliton when the magnetic topological soliton is present in a detection region of the storage element, e.g. an electric signal for characterizing the state of a soliton present in the detection region as a corresponding state out of a plurality of predetermined discernible states. For example, the electric signal may be indicative of different bound state energies of the magnetic topological soliton, for example different radii of a skyrmion.

In a solid-state device according to embodiments, the magnetic strip may be a ferromagnetic strip.

In a solid-state device according to embodiments, the magnetic strip may comprise, or consist of, an out-of-plane magnetized magnetic strip, e.g. an out-of-plane magnetized ferromagnetic strip. For example, the magnetic strip may comprise, or consist of, a ferromagnetic strip having a magnetization oriented in a direction substantially perpendicular, e.g. perpendicular, to the plane of this magnetic strip.

In a solid-state device according to embodiments, the magnetic strip may comprise Co, Fe and/or $CuOFe_2O_3$.

In a solid-state device according to embodiments, the topological insulator may comprise $Bi_2Se_3$, CdTe, $TlBiTe_2$, $Pb_{1-x}Sn_xSe$ and/or $Bi_2Te_3$.

In a solid-state device according to embodiments, the magnetic topological soliton detector may comprise a pair of contacts arranged on opposite sides of the topological insulator. The magnetic topological soliton detector may furthermore be adapted for detecting the electric signal as a change in resistivity or conductivity between the pair of contacts.

In a solid-state device according to embodiments, the magnetic topological soliton detector may comprise a pair of contacts arranged such that a stack of respectively (e.g. in following order) a first contact of the pair of contacts, the topological insulator, the magnetic strip and a second contact of the pair of contacts is formed. The magnetic topological soliton detector may furthermore be adapted for detecting the electric signal as a spin-independent change in tunneling amplitude, e.g. in tunneling probability, between the pair of contacts. For example, the detector may be adapted for detecting the electric signal as a spin-independent change of magnetoresistance.

A solid-state device according to embodiments may further comprise a magnetic topological soliton translation driver for driving the magnetic topological soliton along the storage element.

In a solid-state device according to embodiments, the magnetic topological soliton translation driver may comprise at least two electrical contacts (M1, M2) for creating an electric field over the storage element.

A solid-state device according to embodiments may further comprise a magnetic topological soliton generator for converting an electric signal into the absence or presence of the magnetic topological soliton, e.g. creating such magnetic topological soliton in the storage element, e.g. in a region of the storage element different from the detection region.

In a solid-state device according to embodiments, the magnetic topological soliton generator may be adapted for creating a magnetic topological soliton having a bound state energy selected from a plurality of predetermined discernible states, the bound state energy being selected by taking the electric signal into account. For example, this plurality of predetermined discernible states may correspond to the plurality of predetermined discernible states detectable by the magnetic topological soliton detector. These predetermined discernible states may correspond to a predetermined plurality of different skyrmion radii.

In a solid-state device according to embodiments, the magnetic topological soliton generator may comprise at least one pair of contacts arranged on opposite sides of the topological insulator. The at least one pair of contacts may be adapted for generating a spin-polarized current in the topological insulator such as to create a magnetic topological soliton in the magnetic strip.

In a solid-state device according to embodiments, the storage element may comprise a plurality of magnetic strips on the topological insulator, and the magnetic topological soliton detector may be adapted for generating an electric signal indicative of the number of magnetic topological solitons present in the plurality of magnetic strips in the detection region.

In a further aspect, certain embodiments also relate to a magnetoresistive random access memory comprising a solid-state device according to embodiments of the first aspect.

In a further aspect, certain embodiments also relate to a logic circuit for operating on magnetic topological solitons representative of a logic state, in which the logic circuit comprises a solid-state device according to embodiments of the first aspect.

In a further aspect, some embodiments also relate to a method for generating an electric signal indicative of the presence or absence of a magnetic topological soliton. Such method comprises providing a storage element for storing a magnetic topological soliton, in which the storage element comprises a topological insulator and a magnetic strip arranged on the topological insulator. The method further comprises detecting a presence or absence of a magnetic topological soliton in a detection region of the storage element. This step of detecting is furthermore taking a spin-independent difference in tunneling amplitude, e.g. in tunneling probability, in the detection region, a difference in electrical resistance in the detection region and/or a difference in electrical conductivity through the topological insulator in the detection region into account.

In a method according to embodiments, the step of detecting of the presence or absence may be adapted for detecting the presence or absence of a skyrmion in the magnetic strip at the detection region.

In a method according to embodiments, the step of detecting of the presence or absence may be adapted for generating an electric signal indicative of different states of the magnetic topological soliton, when the magnetic topological soliton is present in a detection region of the storage element. This electric signal may be suitable for characterizing the state of a soliton present in the detection region as a corresponding state out of a plurality of predetermined discernible states. For example, the electric signal may be indicative of different bound state energies of the magnetic topological soliton, for example different radii of a skyrmion.

Some embodiments may allow a way of detecting a magnetic topological soliton.

Some embodiments may allow a solid-state device making use of certain embodiments to be very robust to defects, e.g. due to the topological protection provided by a topological insulator and the stability of magnetic topological soliton states, such as skyrmions.

Some embodiments may allow a high density of information to be stored and/or manipulated in a solid-state device making use of certain embodiments. For example, a small size of magnetic topological soliton states can be achieved, e.g. small skyrmion sizes, such that a higher density of information can be manipulated than in conventional devices occupying the same volume in space.

Some embodiments may allow a low power consumption to be achieved in a solid-state device making use of certain embodiments. For example, the low dissipation surface state of a topological insulator, e.g. a substantially dissipation-free surface state or a dissipation-free surface state, and/or a low current density required for moving the magnetic topological solitons, e.g. for translating skyrmions along a transmission channel, may contribute to a low power consumption.

Particular aspects are set out in the accompanying independent and dependent claims. Features from the dependent claims may be combined with features of the independent claims and with features of other dependent claims as appropriate and not merely as explicitly set out in the claims.

These and other aspects will be apparent from and elucidated with reference to the embodiment(s) described hereinafter.

Figure 1:
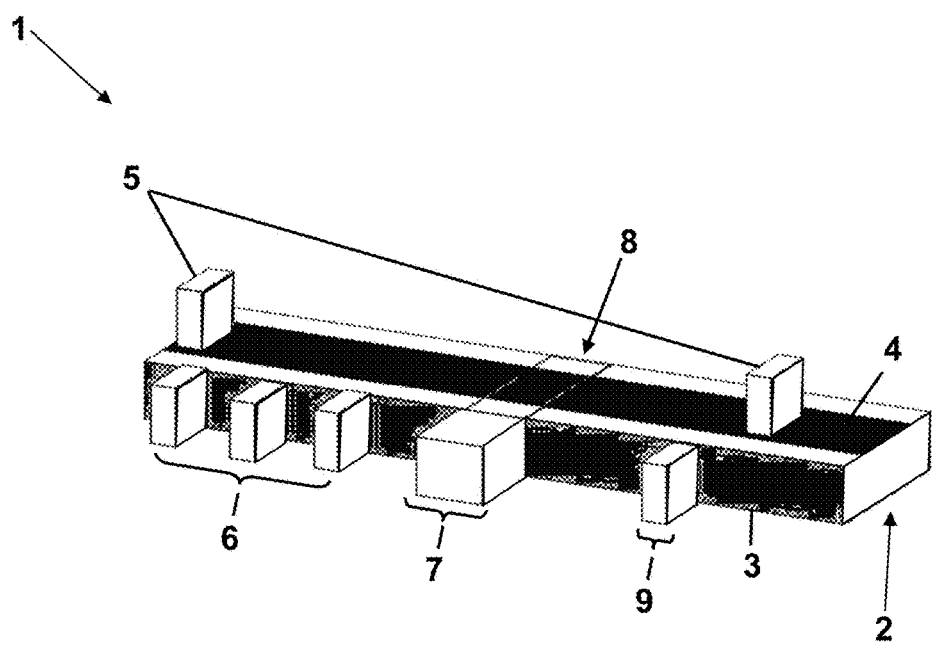
FIG. 1 shows a perspective view of a solid-state device, according to example embodiments.

The drawings are only schematic and are non-limiting. In the drawings, the size of some of the elements may be exaggerated and not drawn on scale for illustrative purposes.

Any reference signs in the claims shall not be construed as limiting the scope.

In the different drawings, the same reference signs refer to the same or analogous elements.

DETAILED DESCRIPTION

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

The terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

Where in embodiments reference is made to a "magnetic topological soliton", reference is made to topological soliton with respect to magnetic field properties, e.g. a soliton solution to a field equation, or to a set of simultaneously satisfied field equations, that involves quantities relating to the magnetic field, e.g. a magnetic field, a magnetic field potential, an angular moment of an electric charge and/or a spin of an electrically charged particle. The magnetic topological soliton may refer to a topological soliton in a ferromagnetic medium or in an antiferromagnetic medium, e.g. the magnetic topological soliton may refer to a ferromagnetic topological soliton. In particular embodiments, the magnetic topological soliton may refer to a magnetic domain wall, a spin wave or a skyrmion.

In a first aspect, some embodiments relate to a solid-state device, e.g. a solid-state component for use in an integrated circuit device. This solid-state device is adapted for generating an electric signal indicative of the presence or absence of a magnetic topological soliton. The solid-state device comprises a storage element for storing a magnetic topological soliton, in which the storage element comprises a topological insulator and a magnetic strip arranged on the topological insulator. The solid-state device also comprises a magnetic topological soliton detector for generating an electric signal indicative of the absence or presence of a magnetic topological soliton in the storage element. The magnetic topological soliton detector is furthermore adapted for detecting a spin-independent difference in tunneling amplitude, e.g. in tunneling probability, a difference in electrical resistance and/or a difference in electrical conductivity through the topological insulator in the detection region, in which this difference is due to the presence or absence of the magnetic topological soliton in the detection region, e.g. in the magnetic strip in the detection region.

Figure 2:
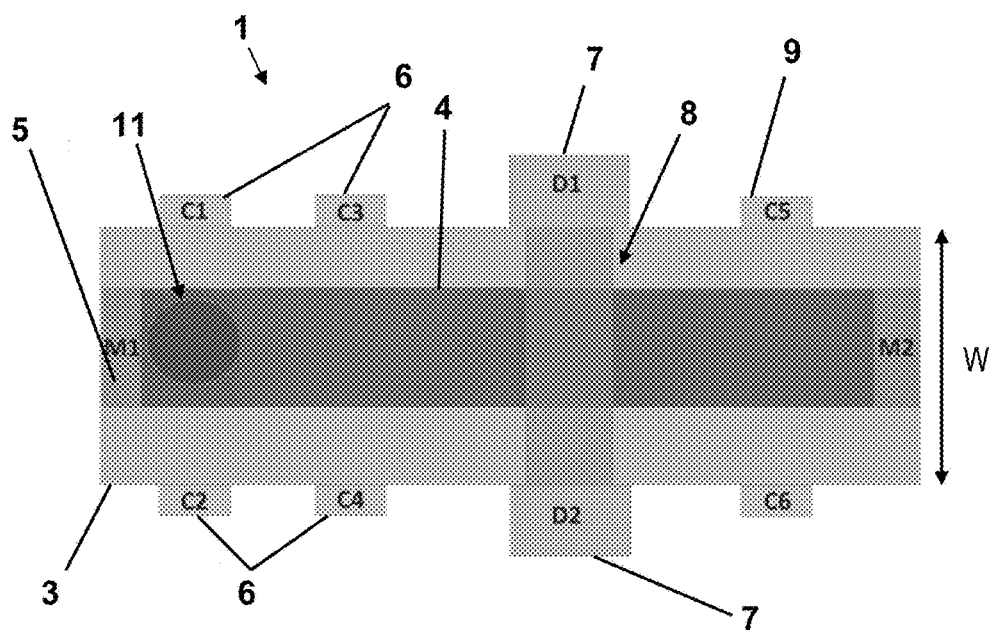
FIG. 2 shows a top-down view of a solid-state device, according to example embodiments.

FIG. 1 and FIG. 2 show a solid-state device 1 according to example embodiments, in perspective and top view, respectively. This solid-state device 1 may be a solid-state component for use in an integrated circuit device, e.g. a data memory, such as a magnetoresistive random access memory, or a logic circuit for operating on magnetic topological solitons representative of a logic state. The solid-state device 1 may comprise an integrated circuit device, e.g. a data memory, such as a magnetoresistive random access memory, or a logic circuit for operating on magnetic topological solitons representative of a logic state.

The solid-state device 1 is adapted for generating an electric signal indicative of the presence or absence of a magnetic topological soliton. For example, the presence or absence of the magnetic topological soliton may be representative of a logic state, e.g. the presence of a magnetic topological soliton, such as a spin wave, domain wall or skyrmion, may be encoded as the logic "1" state. However, where reference is made to logic, embodiments are not necessarily limited to such encoding. For example, presence of the magnetic topological soliton may be indicative of a logic "0" state, or a non-Boolean logic system may be implemented, e.g. using multiple magnetic topological solitons to represent a single atom of information, or encoding a multi-value logic by means of magnetic topological solitons of different type and/or topological charge. References to Boolean states "0" and "1" hereinbelow are therefore only to be considered as states of a data encoding system and/or logic system, e.g. an encoding that represents data by a bit or sequence of bits, in which each bit is selected from a predetermined finite number of mutually exclusive logic atoms. Thus, the use of absence and/or presence of the soliton as indicative of a binary bit state is only intended to be by way of example. For example, a plurality of distinct states of the soliton, e.g. possibly comprising or not comprising a state corresponding to the absence of such soliton, may be used in accordance with embodiments to represent a corresponding plurality of information atom states, e.g. ternary bit states, quaternary bit states, or higher-base bit stated. In the present description, terms such as "information atom" and "elemental data carrier" merely refer to an elementary unit of information and the corresponding physical entity encoding such unit of information, and are not to be construed as limiting to the physical properties of a soliton quasi-particle representing such state in any way.

For example, a solid-state device 1 according to some embodiments may be adapted for generating an electric signal indicative of a state of the magnetic topological soliton, in which this state can be selected from a plurality of states. For example, the plurality of states can correspond to different bound state energies of the soliton, e.g. corresponding to different radii of a skyrmion.

Some embodiments may provide that the topological stability of a soliton, such as a skyrmion, may enable the state of the soliton, as elemental data carrier, to be maintained unaffected, e.g. ideally without a substantial limitation in time. For example, a power source may not be required to actively maintain this state. Furthermore, such soliton states can be efficiently generated, as well as efficiently erased when maintenance of the stored information is no longer required.

The solid-state device 1 comprises a storage element 2 for storing a magnetic topological soliton, e.g. a skyrmion 11. The storage element comprises a topological insulator 3 and a magnetic strip 4 arranged on the topological insulator 3, e.g. on an exterior surface of the topological insulator. In particular embodiments, the magnetic strip may be a ferromagnetic strip. In other embodiments, the magnetic strip 4 may be an anti-ferromagnetic strip. The magnetic strip 4 may for example comprise a magnetically soft material. The magnetic strip may for example comprise Co, Fe and/or $CuOFe_2O_3$. The topological insulator 3, e.g. a 3D topological insulator, may for example comprise $Bi_2Se_3$, CdTe, $TlBiTe_2$, $Pb_{1-x}Sn_xSe$ and/or $Bi_2Te_3$.

The magnetic strip 4, e.g. a ferromagnetic strip, may form a medium in which the magnetic topological soliton, e.g. a skyrmion, can be created and in which the soliton can be transported, e.g. translated along a major spatial dimension of the strip. The topological insulator 3 may be adapted for interacting with the magnetic strip 4 such that the magnetic topological soliton can be created or annihilated in the magnetic strip 4 by means of a current passed through the topological insulator 3 as an initiator for the creation or annihilation process. The topological insulator 3 may be adapted for interacting with the magnetic strip 4 such that the magnetic topological soliton in the magnetic strip 4 can be detected by a change of physical properties of the topological insulator 3 due to this interaction.

In certain embodiments, the magnetic strip 4 may comprise, or consist of, an out-of-plane magnetized magnetic strip, e.g. an out-of-plane magnetized ferromagnetic strip. For example, the magnetization vector of the magnetic strip, e.g. a vector representative of a permanent magnetic field of the strip when not perturbed by a soliton or external influence, may be oriented in a direction substantially perpendicular, e.g. perpendicular, to the plane of this magnetic strip, e.g. parallel to the direction of minimal thickness of the strip.

Depending on the material composition of the magnetic strip, magnetic topological solitons of different sizes can be generated. A high efficiency can be attained when the size of such soliton, e.g. of a skyrmion, is comparable to the width of the magnetic strip as well as to the width of the topological insulator. Thus, a locally created soliton, such as a skyrmion, may have a strong impact on the output of the detector 7.

The solid-state device 1 may also comprise a magnetic topological soliton translation driver 5 for driving the magnetic topological soliton along the storage element 2, e.g. from a generation site to a detection site. The magnetic topological soliton translation driver 5 may be adapted for driving a translation movement of the magnetic topological soliton along the storage element 2. The magnetic topological soliton translation driver 5 may comprise at least two electrical contacts adapted for applying an electric potential difference over the storage element 2, e.g. such as to attract the soliton to a first electrical contact and simultaneously repel the soliton from a second electrical contact of this at least two electrical contacts. For example, the magnetic topological soliton translation driver 5 may comprise electrical contacts M1, M2 for creating an electric field over the storage element 2, e.g. an electric field oriented in the direction of a major spatial axis of the topological insulator. The at least two electrical contacts may for example be configured for receiving a voltage, e.g. corresponding to the electric potential difference, from a controller. The at least two electrical contacts may for example be arranged such as to contact the magnetic strip 4 at two substantially distinct locations, e.g. respectively at a first end region and at a second end region such as to enable the controllable translation of the magnetic topological soliton to a position between this this first end region and the second end region. For example, a magnetic topological soliton in a magnetic strip on top of a topological insulator surface may become charged, such that the soliton can be moved by an electric field. For example, skyrmions on top of topological insulator surface states may become charged and can thus be moved by electric fields.

However, particular embodiments may also comprise more complex translation drivers 5, e.g. using at least three electrical contacts such as to control a two-dimensional motion of the soliton along a plane, e.g. such as to controllably steer the magnetic topological soliton to a selected memory location of a plurality of predetermined memory locations on the storage element 2.

For example, the storage element may form a transmission line for transmitting the magnetic topological soliton form a first site, e.g. a generation site, to a second site, e.g. a detection site, in which this transmitting is controlled and effected by the magnetic topological soliton transmitter 5. For example, a sequence of skyrmions, representative of a data stream, may be generated sequentially in a generation region on the magnetic strip 4, while the sequence is being driven toward a detection region on the magnetic strip 4. At the detection region, the stored information may be read out again.

The solid-state device 1 may comprise a magnetic topological soliton generator 6 for converting an electric signal into the absence or presence of a magnetic topological soliton, e.g. a skyrmion. The magnetic topological soliton generator 6 may for example comprise a plurality of contacts, e.g. at least a pair of contacts that are arranged on opposite sides of the topological insulator 3. For example, the pair of contacts may comprise a pair of contacts having a low resistivity, e.g. as low as reasonably achievable. Such low resistivity may keep the impact on the creation of the solitons as small as possible.

The electric signal may for example be supplied by an electronic component of an integrated circuit, e.g. the magnetic topological soliton generator 6 may be adapted for receiving an electric signal. The electric signal may be converted by the soliton generator 6 into the absence or presence of the magnetic topological soliton at a generation site of the storage element 2. For example, the storage element 2 may comprise a generation site. The magnetic topological generator 6 may be arranged at the generation site and may be configured such as to generate a magnetic topological soliton at the generation site in response to the electric signal received by the generator 6.

For example, as shown in FIG. 2, the magnetic topological soliton generator 6 may comprise a plurality of contacts C1-C4 arranged on two opposite sides of the topological insulator. For example, the topological insulator may have a rectangular cuboid shape, in which the three orthogonal directions of the edges of this shape correspond to a major spatial axis, a first minor spatial axis and a second minor spatial axis. The major spatial axis may correspond to a direction along which a magnetic topological soliton can be translated over the magnetic strip, e.g. by the magnetic topological soliton translation driver 5. The magnetic strip may contact the topological insulator at a face of the topological insulator that is parallel to the major spatial axis and the first minor spatial axis. The plurality of contacts of the magnetic topological soliton generator 6 may contact the topological insulator at the two faces of the cuboid shaped topological insulator that are parallel to the major spatial axis and the second minor spatial axis. The terms 'major' and 'minor' refer to the topological insulator having a length L in the direction of the major spatial axis that is at least an order of magnitude larger than each of the width W and the height H in respectively the direction of the first minor spatial axis and the second minor spatial axis, e.g. $L \geq 10 \cdot W$ and $L \geq 10 \cdot H$.

The contacts of the magnetic topological soliton generator 6, e.g. the pair of contacts, or each pair of contacts on opposite sides of the topological insulator, may be adapted for generating spin-polarized currents for locally nucleating skyrmions in the magnetic strip. For example, a spin-polarized current running through the topological insulator, e.g. generated by a voltage gradient between the contacts in a direction substantially corresponding to the first minor spatial axis, may be injected into the magnetic strip in a direction corresponding to the second minor spatial axis, e.g. corresponding to an out-of-the-page direction in FIG. 2. For example, the large spin-hall angle provided by the topological insulator surface can be used for the creation of large spin-polarized currents. The magnetic topological soliton generator 6 may comprise a pulse generator for generating short pulses of spin-polarized currents in the storage element 2 via the contacts C1-C4, e.g. such as to locally create skyrmions. In example embodiments, skyrmions can be created in the size range of 1 nm to 10 nm, e.g. 2 nm to 8 nm, e.g. 3 nm to 5 nm, e.g. of only a few nm, such that the density of skyrmions stored on the storage element 2 can be very high.

A plurality of pairs of contacts in the magnetic topological soliton generator, e.g. as shown in FIG. 1 and FIG. 2, may allow a number of magnetic topological solitons to be created simultaneously, e.g. each pair of contacts arranged on opposite sides of the topological insulator may create a soliton, e.g. a skyrmion, simultaneously. Thus, for example 2, 3 or 4, or even more, e.g. 8, 16 or 32, or in general any number as appropriate in view of the application, solitons may be generated simultaneously, and then, for example, shifted forward using the magnetic topological soliton translation driver 5.

For example, a soliton may be generated as indicative of a received data bit having value "1", while receiving a data bit having value "0" may result in not generating a soliton. For example, a current may be generated, e.g. in response to a received data bit having value "1", at a contact of the magnetic soliton generator that is configured such as to create a skyrmion in the magnetic strip 4 at the generation site. Furthermore, the generator may be adapted for actively erasing a soliton when such soliton is already present at the generation site, e.g. in response to a data bit having value "0". Thus, the generator 6 may be adapted for overwriting, erasing and/or annihilating a magnetic topological soliton. However, additionally or alternatively, the solid-state device 1 may comprise a magnetic topological soliton eraser 9 for erasing and/or annihilating the magnetic topological soliton, e.g. a skyrmion. The magnetic topological soliton eraser 9 may for example comprise a pair of contacts that are arranged on opposite sides of the topological insulator 3. An electric signal supplied to this pair of contacts may cause a soliton state at an erasure region on the storage element 2 to loose coherence, e.g. may convert the soliton state to a non-soliton state, e.g. a ground state of the materials of the storage element 2 in the erasure region. While a soliton generation and soliton erasure function can both be implemented by the generator 6, embodiments may allow a magnetic topological soliton eraser 9, distinct from the magnetic topological soliton generator 6, to be arranged such that a magnetic topological soliton can be moved, e.g. by the translation driver 5, from the generator 6 to the detector 7, and then from the detector 7 to the eraser 9 without reversing the direction of movement. For example, a sequence of magnetic topological solitons, e.g. a sequence of arbitrary length, can be generated, moved to the detector, detected, moved to the eraser and erased. This flow of solitons may be paused, e.g. such as to implement a buffer-like memory function, or that this flow of solitons may be used in a data transmission system, e.g. for sending information from the generator 6 to the detector 7, in which a substantial distance between the generator and the detector may exist.

The magnetic topological soliton generator 6 may be adapted for generating different solitons, having different bound state energies, indicative of different values received by the generator, e.g. skyrmions having different radii determined by a value encoded by a digital plurality of bits received by the generator as input.

The solid-state device 1 comprises a magnetic topological soliton detector 7 for generating an electric signal indicative of the absence or presence of a magnetic topological soliton in the storage element, e.g. in a detection region 8 thereof. The magnetic topological soliton detector is adapted for detecting a spin-independent difference in tunneling amplitude, e.g. in tunneling probability, a difference in electrical resistance and/or a difference in electrical conductivity through the topological insulator in the detection region, in which this difference is due to the presence or absence of the magnetic topological soliton in the detection region, e.g. in the magnetic strip in the detection region. The magnetic topological soliton detector may be adapted for detecting a difference in conductivity, or equivalently a difference in resistivity, caused by the presence of a magnetic topological soliton, e.g. a skyrmion, in a detection region 8 of the storage element, e.g. a difference with respect to the absence of such magnetic topological soliton. For example, a logic "1," e.g. represented by a presence of a skyrmion, may result in a change in the conductivity, while a logic "0", e.g. represented by an absence of a skyrmion, will leave the conductivity unaffected, e.g. with respect to a ground state conductivity. Magnetic topological soliton detection in accordance with certain embodiments may provide that the topological stability of such solitons, e.g. of skyrmions, is such that the detection can be performed non-destructively, e.g. while maintaining the soliton state.

A solid-state device 1 according to some embodiments may be adapted for generating an electric signal indicative of a state of the magnetic topological soliton, in which this state can be selected from a plurality of predetermined states. This electrical signal can be integrated with the electrical signal for indicating the absence or presence of the soliton, e.g. an electrical signal may be generated indicative of the absence of a magnetic topological soliton and indicative of the state of a soliton when present in a detection region of the storage element, e.g. each state of the soliton and the absence of the soliton may be encoded as different digital values output on parallel signal lines or a serial signal line. For example, the plurality of states can correspond to different bound state energies of the soliton, e.g. corresponding to different radii of a skyrmion. For example, a logic bit pair "00", e.g. represented by an absence of a skyrmion, will leave the conductivity unaffected, e.g. with respect to a ground state conductivity, while logic bit pairs "01", "10" and "11" may correspond to the presence of a skyrmion having respectively a first, a second and a third bound state energy which may result in three distinct changes in the conductivity. Such different bound state energies may correspond to skyrmions having different, predetermined radii. It shall be clear to the skilled person that three different states in combination with the absence of the magnetic topological soliton to encode four values of a bit pair can be generalized to any number of different states, e.g. 2, 3, 4, 5, 6, 7 or even higher, e.g. 15, 31, 63, or even more higher, e.g. 127, 256, or in general any integer number, insofar the storage element is adapted for storing each distinct state and the detector is adapted for discerning each state within an acceptable tolerance level.

The magnetic topological soliton detector 7 may comprise a pair of contacts arranged on opposite sides of the storage element 2, such that the electric signal indicative of the absence or presence of the magnetic topological soliton in the storage element can be detected by a change in resistivity or conductivity between this pair of contacts. For example, the pair of contacts may comprise a pair of contacts having a low resistivity (e.g., as low as reasonably achievable). Such low resistivity may keep the impact on the detection of the solitons as small as possible.

The pair of contacts may be arranged on opposite sides of the storage element 2 such that the topological insulator intersects the volume of space in between the pair of contacts, but the magnetic strip does not intersect the volume of space in between the pair of contacts. Thus, the magnetic topological soliton detector 7 may be configured for measuring an electrical signal, such as a current, through the topological insulator. For example, the magnetic topological soliton detector 7 may comprise a pair of contacts D1, D2 arranged on opposite sides of the topological insulator 2, e.g. each contact contacting the topological insulator on a respective surface of the topological insulator. The magnetic topological soliton detector 7 may furthermore be adapted for detecting the electric signal as a change in resistivity or conductivity between this pair of contacts.

The pair of contacts may be arranged on opposite sides of the storage element 2 such that the topological insulator and the magnetic strip intersect the volume of space in between the pair of contacts. Thus, the magnetic topological soliton detector 7 may be configured for performing a tunnel magnetoresistive measurement. For example, the magnetic topological soliton detector 7 may comprise a pair of contacts such that a stack of respectively a first contact of this pair of contacts, the topological insulator 3, the magnetic strip 4 and a second contact of the pair of contacts is formed. The magnetic topological soliton detector 7 may thus be adapted for detecting the electric signal as a spin-independent change in tunneling amplitude, e.g. in tunneling probability, between the pair of contacts.

The electrical signal generated by the magnetic topological soliton detector 7 may be supplied to a conventional electronic logic circuit, e.g. such as to process or store the information stored in the soliton state in a conventional manner, e.g. using electronic logic gates.

Some embodiments provide a way of detecting magnetic topological solitons, e.g. a transmission channel for the solitons can be formed by a magnetic strip, e.g. a ferromagnetic strip, on a topological insulator, while a pair of contacts can be used to detect the soliton when present in the detection zone.

Figure 3:
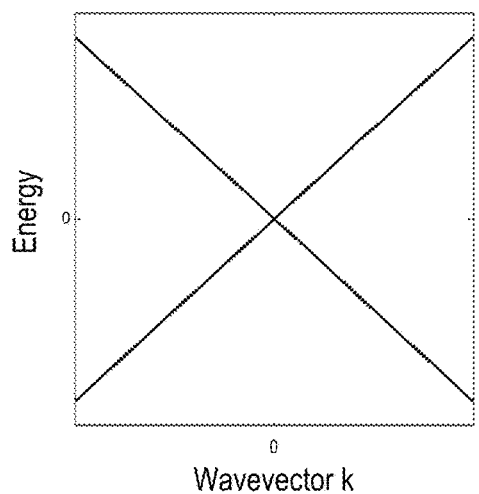
FIG. 3 shows a band structure of a topological insulator when no magnetic topological soliton is present, according to example embodiments.
Figure 4:
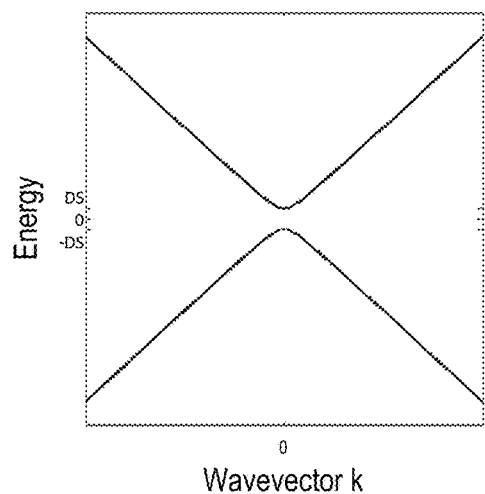
FIG. 4 shows a band structure of a topological insulator when a magnetic topological soliton in the form of a skyrmion is present, according to example embodiments.

If a magnetic topological soliton is present in the detection region 8, a local change in the band structure of the topological insulator may occur, e.g. by opening a gap at the Dirac point. This is illustrated in FIG. 3 and FIG. 4. For example, FIG. 3 depicts the situation in which no skyrmion is present on the topological insulator surface, while FIG. 4 shows the opened gap when a skyrmion is present on the topological insulator surface. This change in the band structure may result in a change in charge density, which can then be detected as a change in the conductivity. For example, a strong interaction of, for example, a skyrmion texture with the topological insulator surface state may result in a clear and robust read-out. For example, an effective exchange interaction strength may be achieved comparable to kT (e.g., 25 meV) at room temperature, or even stronger. The interaction strength may depend on the magnitude of the magnetization of the magnetic strip, e.g. of the ferromagnetic strip, the density of spins and the total interaction width.

The solid-state device 1 may also comprise a controller. This controller may comprise a hardware clock, timer or frequency generator, for clocking the detection of solitons by the magnetic topological soliton detector 7, e.g. such as to activate and detect at specific times whether there is a magnetic topological soliton being driven through the detection region by the magnetic topological soliton translation driver 5. The controller may for example also control the magnetic topological soliton translation driver 5, e.g. controlling the velocity at which the solitons are driven.

After read-out, the magnetic topological soliton, unaffected by the readout process, may be moved to a further storage element, e.g. having a structure similar to the storage element 2. This further storage element may serve as a magnetic topological soliton storage unit, e.g. a skyrmion-based data storage unit.

The solid-state device 1 may comprise a magnetoresistive random access memory, e.g. adapted for storing data in the form of magnetic topological solitons, e.g. skyrmions.

The solid-state device 1 may comprise a logic circuit for operating on magnetic topological solitons, e.g. skyrmions, representative of a logic state.

Figure 5:
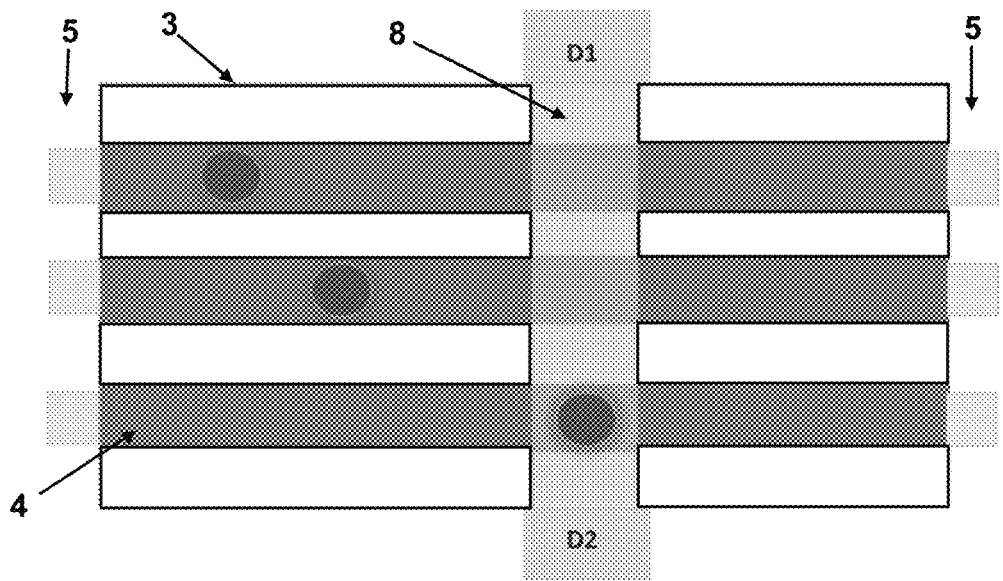
FIG. 5 shows a solid-state device, comprising a plurality of magnetic strips and configured as a majority gate device, according to example embodiments.

The solid-state device 1 may comprise a majority gate. For example, the storage element 2 may comprise a topological insulator 3 and a plurality of magnetic strips 4 on the topological insulator 3. For example, the plurality of magnetic strips, e.g. ferromagnetic strips, may be configured such as to allow a magnetic topological soliton to be present in each of the magnetic strips without substantial interaction between solitons when present in different magnetic strips. The magnetic topological soliton detector 7 may comprise a pair of contacts arranged on opposite sides of the topological insulator, such that the electric signal indicative of the number of magnetic topological solitons present in the storage element in the detection region 8 can be detected by a change of resistivity or conductivity between this pair of contacts. For example, if the storage element 2 comprises three magnetic strips as illustrated in FIG. 5, if two out of three possible solitons, e.g. skyrmions, are present at the detection region, then the measured conductivity will change more than in the case where only a single soliton, e.g. a single skyrmion, was present in the detection region. Therefore, a majority gate operation can be implemented without first converting each soliton, e.g. each skyrmion, independently to the corresponding logic "1" or "0" value. Majority gates, such as the present embodiment, may form an important component of adder designs, and may furthermore be used in, for example, neural networks.

In a second aspect, some embodiments relate to a method for generating an electric signal indicative of the presence or absence of a magnetic topological soliton. The method comprises providing a storage element for storing a magnetic topological soliton, in which the storage element comprises a topological insulator and a magnetic strip arranged on the topological insulator. The method further comprises detecting a presence or absence of a magnetic topological soliton in a detection region of the storage element. This step of detecting takes a spin-independent difference in tunneling amplitude, e.g. in tunneling probability, a difference in electrical resistance and/or a difference in electrical conductivity through the topological insulator in the detection region into account.

For example, a method according to the second aspect may be implemented in, or performed using, a solid-state device in accordance with embodiments of the first aspect.

The step of providing the storage element may comprise providing a magnetic strip 4 arranged on a topological insulator 3, e.g. on an exterior surface of the topological insulator. The magnetic strip may be a ferromagnetic strip or an anti-ferromagnetic strip. The magnetic strip 4 may for example comprise a magnetically soft material. The magnetic strip may for example comprise Co, Fe and/or $CuOFe_2O_3$. The topological insulator 3, e.g. a 3D topological insulator, may for example comprise $Bi_2Se_3$, CdTe, $TlBiTe_2$, $Pb_{1-x}Sn_xSe$ and/or $Bi_2Te_3$.

The method according to some embodiments may comprise creating and/or annihilating a magnetic topological soliton, e.g. a skyrmion, in the magnetic strip 4. This creating and/or annihilating may comprise passing a current through the topological insulator 3, such that an interaction of the topological insulator 3 with the magnetic strip 4 creates and/or annihilates the magnetic topological soliton in the magnetic strip 4.

Creating the magnetic topological soliton may comprise converting an electric signal into the absence or presence of a magnetic topological soliton, e.g. a skyrmion.

Creating the magnetic topological soliton may comprise generating a spin-polarized current running through the topological insulator.

Creating the magnetic topological soliton may comprise generating pulses, e.g. short pulses, of spin-polarized currents in the storage element 2 such as to locally create a soliton, e.g. a skyrmion, in the magnetic strip.

The method according to some embodiments may comprise transporting the magnetic topological soliton through the storage element, e.g. translating the soliton along a major spatial dimension of the magnetic strip. This transporting may comprise controlling a magnetic topological soliton translation driver 5 for driving the magnetic topological soliton along the storage element 2 in a device according to embodiments of the first aspect. For example, transporting the magnetic topological soliton may comprise translating the soliton, e.g. a skyrmion, from a generation site to a detection site.

The transporting may comprise applying an electric potential difference over the storage element 2, e.g. may comprise creating an electric field over the storage element 2, e.g. an electric field oriented in the direction of a major spatial axis of the topological insulator.

The step of detecting the presence or absence of the magnetic topological soliton in a method according to some embodiments may comprise generating an electric signal indicative of the absence or presence of the magnetic topological soliton in the storage element, e.g. in a detection region 8 thereof. This detecting may comprise detecting a spin-independent difference in tunneling amplitude, e.g. in tunneling probability, a difference in electrical resistance and/or a difference in electrical conductivity through the topological insulator in the detection region, in which this difference is due to the presence or absence of the magnetic topological soliton in the detection region, e.g. in the magnetic strip in the detection region.

The step of detecting the presence or absence of the magnetic topological soliton may comprise detecting a change in resistivity or conductivity between a pair of electrical contacts in electrical contact with the topological insulator at two opposite sides thereof.

The step of detecting the presence or absence of the magnetic topological soliton may comprise detecting a spin-independent change in tunneling amplitude, e.g. in tunneling probability, e.g. as a magnetoresistance measured over a pair of electrical contacts arranged such that a stack of respectively a first contact of this pair of contacts, the topological insulator 3, the magnetic strip 4 and a second contact of the pair of contacts is formed.

In a method according to some embodiments, a magnetic topological soliton, e.g. a skyrmion, may be moved to a further storage element, e.g. having a structure similar to the storage element 2, after the step of detecting the presence or absence of the magnetic topological soliton. This further storage element may serve as a magnetic topological soliton storage unit, e.g. a skyrmion-based data storage unit.

In a method according to some embodiments, a magnetic topological soliton, e.g. a skyrmion, may be annihilated after the step of detecting the presence or absence of the magnetic topological soliton.

In a method according to some embodiments, the step of detecting the presence or absence of the soliton may be adapted for generating an electric signal indicative of different states of the magnetic topological soliton, when the magnetic topological soliton is present in a detection region of the storage element. This electric signal may be suitable for characterizing the state of a soliton present in the detection region as a corresponding state out of a plurality of predetermined discernible states. For example, the electric signal may be indicative of different bound state energies of the magnetic topological soliton, for example different radii of a skyrmion.

Some embodiments may also relate to the use of method or device according to embodiments of respectively the second or first aspect in a memory device, e.g. a random access memory, such as a magnetoresistive random access memory.

Some embodiments may also relate to the use of method or device according to embodiments of respectively the second or first aspect in a logic circuit for operating on magnetic topological solitons representative of a logic state.

Some embodiments may also relate to the use of method or device according to embodiments of respectively the second or first aspect in a majority gate, e.g. for use in an adder circuit or a circuit implementing a neural network.

What is claimed is:

1. A solid-state device configured to generate an electric signal indicative of a presence or an absence of a magnetic topological soliton, the solid-state device comprising:
   a storage element configured to store a magnetic topological soliton, the storage element comprising:
      a topological insulator; and
      a magnetic strip arranged on the topological insulator; and
   a magnetic topological soliton detector configured to generate the electric signal indicative of the presence or the absence of the magnetic topological soliton in a detection region of the storage element, wherein the magnetic topological soliton detector is adapted for detecting a spin-independent difference in tunneling amplitude through the topological insulator in the detection region due to the presence or the absence of the magnetic topological soliton in the detection region.

2. The solid-state device according to claim 1, wherein the magnetic strip is a ferromagnetic strip.

3. The solid-state device according to claim 2, wherein the magnetic strip comprises Co, Fe, or $CuOFe_2O_3$.

4. The solid-state device according to claim 1, wherein the topological insulator comprises $Bi_2Se_3$, CdTe, $TlBiTe_2$, $Pb_{1-x}Sn_xSe$, or $Bi_2Te_3$.

5. The solid-state device according to claim 1, wherein the magnetic topological soliton detector comprises a pair of contacts arranged such that a stack of, respectively, a first contact of the pair of contacts, the topological insulator, the magnetic strip, and a second contact of the pair of contacts is formed, and wherein the magnetic topological soliton detector is adapted for detecting the electric signal as a spin-independent change in tunneling amplitude between the pair of contacts.

6. The solid-state device according to claim 1, further comprising a magnetic topological soliton translation driver configured to drive the magnetic topological soliton along the storage element.

7. The solid-state device according to claim 6, wherein the magnetic topological soliton translation driver comprises at least two electrical contacts configured to create an electric field over the storage element.

8. The solid-state device according to claim 1, further comprising a magnetic topological soliton generator configured to convert an electric signal into the absence or the presence of the magnetic topological soliton.

9. The solid-state device according to claim 8, wherein the magnetic topological soliton generator comprises at least one pair of contacts arranged on opposite sides of the topological insulator, and wherein the at least one pair of contacts is adapted for generating a spin-polarized current in the topological insulator to create magnetic topological solitons in the magnetic strip.

10. The solid-state device according to claim 1, wherein the storage element comprises a plurality of magnetic strips on the topological insulator, and wherein the magnetic topological soliton detector is adapted for generating an electric signal indicative of a number of magnetic topological solitons present in the plurality of magnetic strips in the detection region.

11. The solid-state device according to claim 1, wherein the solid-state device is a part of a logic circuit configured to operate on magnetic topological solitons representative of a logic state.

12. A magnetoresistive random access memory comprising a solid-state device, wherein the solid-state device is configured to generate an electric signal indicative of a presence or an absence of a magnetic topological soliton, and wherein the solid-state device comprises:
   a storage element configured to store a magnetic topological soliton, the storage element comprising:
      a topological insulator; and
      a magnetic strip arranged on the topological insulator; and
   a magnetic topological soliton detector configured to generate the electric signal indicative of the presence or the absence of the magnetic topological soliton in a detection region of the storage element, wherein the magnetic topological soliton detector is adapted for detecting a spin-independent difference in tunneling amplitude through the topological insulator in the detection region due to the presence or the absence of the magnetic topological soliton in the detection region.

13. A method of generating an electric signal indicative of a presence or an absence of a magnetic topological soliton, the method comprising:
   providing a storage element configured to store a magnetic topological soliton, wherein the storage element comprises a topological insulator and a magnetic strip arranged on the topological insulator; and
   detecting the presence or the absence of the magnetic topological soliton in a detection region of the storage element, wherein detecting the presence or the absence of the magnetic topological soliton takes into account a spin-independent difference in tunneling amplitude through the topological insulator in the detection region.

14. The method according to claim 13, wherein the detecting of the presence or the absence is adapted for detecting the presence or the absence of a skyrmion in the magnetic strip at the detection region.

15. The method according to claim 13, further comprising driving, by a magnetic topological soliton translation driver, the magnetic topological soliton along the storage element.

16. The method according to claim 15, further comprising creating, by at least two electrical contacts of the magnetic topological soliton translation driver, an electric field over the storage element.

17. The method according to claim 13, further comprising converting, by a magnetic topological soliton generator, an electric signal into the absence or the presence of the magnetic topological soliton.

18. The method according to claim 17, further comprising generating, by at least one pair of contacts arranged on opposite sides of the magnetic topological soliton generator, a spin-polarized current in the topological insulator to create magnetic topological solitons in the magnetic strip.

19. The method according to claim 14, wherein the magnetic strip is a ferromagnetic strip.

* * * * *